US006894342B1

(12) United States Patent
Hui et al.

(10) Patent No.: US 6,894,342 B1
(45) Date of Patent: May 17, 2005

(54) STRUCTURE AND METHOD FOR PREVENTING UV RADIATION DAMAGE IN A MEMORY CELL AND IMPROVING CONTACT CD CONTROL

(75) Inventors: Angela Hui, Fremont, CA (US); Minh V. Ngo, Fremont, CA (US); Ning Cheng, Cupertino, CA (US); Jaeyong Park, Sunnyvale, CA (US); Jean Y. Yang, Sunnyvale, CA (US); Hirokazu Tokuno, San Jose, CA (US); Kouros Ghandehari, Santa Clara, CA (US); Hidehiko Shiraiwa, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 10/460,278

(22) Filed: Jun. 12, 2003

(51) Int. Cl.$^7$ .............................................. H01L 29/788
(52) U.S. Cl. ........................................ 257/317; 438/780
(58) Field of Search ........................................... 257/317

(56) References Cited

U.S. PATENT DOCUMENTS 5,721,167 A * 2/1998 Subramanian et al. ...... 438/238
5,985,517 A * 11/1999 Tanaka et al. ............... 430/311
6,410,210 B1   6/2002 Gabriel
6,548,423 B1 * 4/2003 Plat et al. .................... 438/780

* cited by examiner

*Primary Examiner*—David Nelms
*Assistant Examiner*—Thao P. Le
(74) *Attorney, Agent, or Firm*—Farjami & Farjami LLP

(57) ABSTRACT

According to one exemplary embodiment, a structure comprises a substrate. The structure further comprises at least one memory cell situated on the substrate. The at least one memory cell may be, for example, a SONOS flash memory cell. The structure further comprises an interlayer dielectric layer situated over at least one memory cell and over the substrate. The structure further comprises a first antireflective coating layer situated over the interlayer dielectric layer. According to this exemplary embodiment, the structure further comprises a second antireflective coating layer situated directly over the first anti reflective coating layer. Either the first antireflective coating layer or second antireflective coating layer must be a silicon-rich layer. The first antireflective coating layer and the second antireflective coating may form a UV radiation blocking layer having a UV transparency less than approximately 1.0 percent, for example.

12 Claims, 2 Drawing Sheets

STRUCTURE AND METHOD FOR PREVENTING UV RADIATION DAMAGE IN A MEMORY CELL AND IMPROVING CONTACT CD CONTROL

TECHNICAL FIELD

The present invention is generally in the field of semiconductor devices. More particularly, the present invention is in the field of semiconductor memory devices.

BACKGROUND ART

Non-volatile memory devices are currently in widespread use in electronic components that require the retention of information when electrical power is terminated. Non-volatile memory devices include read-only-memory (ROM), programmable-read-only memory (PROM), erasable-programmable-read-only-memory (EPROM), and electrically-erasable-programmable-read-only-memory (EEPROM) devices. EEPROM devices differ from other non-volatile memory devices in that they can be electrically programmed and erased. Flash memory devices are similar to EEPROM devices in that memory cells can be programmed and erased electrically. However, flash memory devices enable the erasing of all memory cells in the device using a single current pulse.

In flash memory devices, Silicon-Oxide-Nitride-Oxide-Silicon ("SONOS") memory cells, such as Advanced Micro Devices' ("AMD") MirrorBit™ memory cell, can be utilized to achieve long data retention, low-voltage operation, and fast programming speed. A SONOS memory cell, such as Advanced Micro Devices' ("AMD") MirrorBit™ memory cell, includes a polycrystalline silicon ("poly") gate situated on an Oxide-Nitride-Oxide ("ONO") stack. The ONO stack is a three layer structure including a bottom oxide layer situated on a substrate, a nitride layer situated over the bottom oxide layer, and a top oxide layer situated over the nitride layer. During programming, electrical charge is transferred from the substrate to the silicon nitride layer in the ONO stack. Voltages are applied to the gate and drain creating vertical and lateral electric fields, which accelerate the electrons along the length of the channel. As the electrons move along the channel, some of them gain sufficient energy to jump over the potential barrier of the bottom oxide layer and become trapped and stored in the nitride layer.

In a flash memory cell, such as the SONOS flash memory cell discussed above, threshold voltage ("Vt"), which can be defined as the gate voltage required to obtain a desired source-to-drain current, must be controlled to achieve optimal memory cell performance and power consumption. If Vt is too high, for example, memory cell performance can decrease. One cause of unacceptably high Vt is ultraviolet ("UV") radiation-induced charge in dielectric areas and layers in and adjacent to the memory cell, such as gate spacers and ONO stack layers. UV radiation-induced charging results from semiconductor fabrication processes that produce UV radiation, such as plasma etching and chemical vapor deposition ("CVD") processes. When Vt is too high as a result of UV radiation-induced charge, adjusting processing parameters, such as implantation dosage, may not be effective in sufficiently lowering Vt. Thus, UV radiation-induced charge causes decreased Vt control in the memory cell, which decreases memory cell performance.

The UV radiation-induced charge discussed above comprises electrons and holes, which have a high energy as a result of being induced by high-energy UV radiation. As a result, the high-energy electrons and holes induced by the high-energy UV radiation can damage critical layers of the memory cell, such as the bottom oxide layer of the ONO stack, which serves as a "tunnel" for electrons to charge the nitride layer of the ONO stack during memory cell programming. As a result of damage to the bottom oxide layer of the ONO stack caused by UV radiation, memory cell reliability is reduced.

Moreover, due to lack of adequate blocking of reflections (UV or otherwise) in conventional process technologies, critical dimension control of contacts is significantly impaired. It is thus desirable to resolve both the UV radiation and the contact critical dimension control problems. Thus, there is a need in the art for an effective structure to prevent UV radiation from decreasing performance and reliability of a memory cell, such as a SONOS flash memory cell. Moreover, there is a need in the art to exercise better control over contact critical dimension.

SUMMARY

The present invention is directed to structure and method for preventing UV radiation damage in a memory cell and improving contact CD control. The present invention addresses and resolves the need in the art for an effective structure to prevent UV radiation from decreasing performance and reliability of a memory cell, such as a SONOS flash memory cell, while also improving control over contact critical dimension.

According to one exemplary embodiment, a structure comprises a substrate. The structure further comprises at least one memory cell situated on the substrate. The at least one memory cell may be, for example, a SONOS flash memory cell. The structure further comprises an interlayer dielectric layer situated over the at least one memory cell and over said substrate. The structure further comprises a first antireflective coating layer situated over the interlayer dielectric layer. The first antireflective coating layer may be silicon oxynitride, silicon nitride, silicon-rich oxide, or silicon-rich nitride, for example.

According to this exemplary embodiment, the structure further comprises a second antireflective coating layer situated directly over the first antireflective coating layer. The second antireflective coating layer may be silicon oxynitride, silicon nitride, silicon-rich nitride, or silicon-rich oxide, for example. Either the first antireflective coating layer or the second antireflective coating layer must be a silicon-rich layer. The first antireflective coating layer and the second antireflective coating may form a UV radiation blocking layer having a UV transparency less than approximately 1.0 percent, for example. The first and second antireflective coating layers may have different refractive indexes and absorption coefficients, for example. The structure may further comprise an oxide cap layer situated over the second antireflective coating layer. In one embodiment, the invention is a method for achieving the above-described structure. Other features and advantages of the present invention will become more readily apparent to those of ordinary skill in the art after reviewing the following detailed description and accompanying drawings.

DETAILED DESCRIPTION OF THE INVENTION

The present invention is directed to structure and method for preventing UV radiation damage in a memory cell and improving contact CD control. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

The present invention involves the utilization of dual ARC layers to protect memory cells from adverse effects of UV radiation and to provide increased control of contact critical dimension ("CD"). As will be discussed in detail below, by protecting memory cells from the adverse effects of UV radiation, the present invention advantageously achieves increased threshold voltage control, which results in increased memory cell performance and reliability. The present invention can be applied to any non-volatile memory, including flash memory. Although a SONOS flash memory cell is utilized to illustrate the present invention, the present invention can also be applied to flash memory cells utilizing floating gate memory technology.

Figure 1:
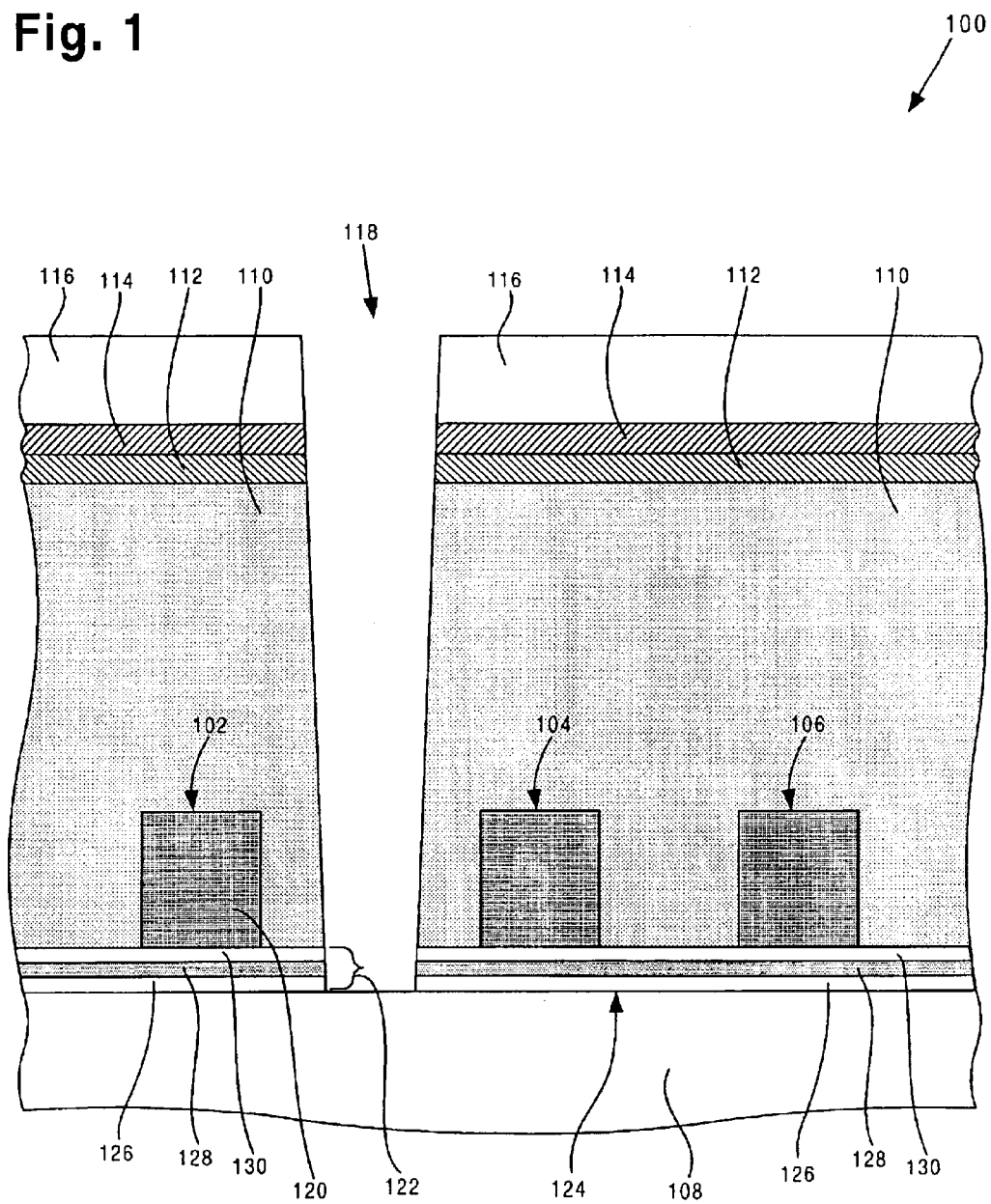
FIG. 1 illustrates a cross-sectional view of a structure, including exemplary memory cells, in accordance with one embodiment of the present invention.

FIG. 1 shows a cross-sectional view of an exemplary structure in accordance with one embodiment of the present invention. Structure 100 includes memory cells 102, 104, and 106, silicon substrate 108, interlayer dielectric (ILD) layer 110, ARC layers 112 and 114, oxide cap layer 116, and contact hole 118. Structure 100 can be, for example, part of non-volatile memory array, such as a flash memory array. Memory cell 102 includes gate 120, ONO stack 122, gate spacers (not shown in FIG. 1), and source and drain regions (not shown in FIG. 1).

As shown in FIG. 1, memory cell 102 includes ONO stack 122, which is situated on top surface 124 of silicon substrate 108. In the present embodiment, memory cell 102 can be a SONOS memory cell, such as an AMD MirrorBit™ memory cell. In one embodiment, memory cell 102 can be a floating gate memory cell. ONO stack 122 is a three-layer structure, which comprises silicon oxide layer 126, silicon nitride layer 128, and silicon oxide layer 130. ONO stack 122 can be formed by depositing and patterning an ONO layer in a manner known in the art.

Also shown in FIG. 1, memory cell 102 further includes gate 120, which is situated over ONO stack 122. Gate 120 can comprise polycrystalline silicon, which can be deposited over ONO stack 122 using a low-pressure chemical vapor deposition ("LPCVD") process and patterned in a manner known in the art. By way of example, gate 120 can have a thickness of between approximately 1000.0 Angstroms and approximately 3000.0 Angstroms. It is noted that although only memory cell 102 is described in detail herein to preserve brevity, memory cells 104 and 106 are similar to memory cell 102 in composition and manner of fabrication.

Further shown in FIG. 1, ILD layer 110 is situated over memory cells 102, 104, and 106 and over ONO stack 122 on top surface 124 of silicon substrate 108. In the present embodiment, ILD layer 110 can comprise borophosphosilicate glass ("BPSG") and can be deposited using a CVD process. In another embodiment, ILD layer 110 can be silicon oxide or other appropriate dielectric material. By way of example, ILD layer 110 can have a thickness of between approximately 4500.0 Angstroms and approximately 8500.0 Angstroms. Also shown in FIG. 1, ARC layer 112 is situated over ILD layer 110. ARC layer 112 can comprise silicon oxynitride, silicon nitride, silicon-rich oxide, or silicon-rich nitride, for example. By way of example, ARC layer 112 can have a thickness of between approximately 100.0 Angstroms and approximately 500.0 Angstroms. ARC layer 112 can be deposited over ILL layer 110 using a plasma-enhanced chemical vapor deposition ("PECVD") process, for example.

Also shown in FIG. 1, ARC layer 114 is situated directly above ARC layer 112. ARC layer 112 can comprise silicon oxynitride, silicon nitride, silicon-rich nitride, or silicon-rich oxide, for example. By way of example, ARC layer 114 can have a thickness of between approximately 100.0 Angstroms and approximately 500.0 Angstroms. ARC layer 114 can be deposited over ARC layer 112 using a PECVD process, for example. The refractive index ("n"), absorption coefficient ("k"), and thickness of ARC layer 112 and ARC layer 114 determine the reflectivity and "UV transparency" of ARC layer 112 and ARC layer 114, respectively. By way of background, "UV transparency" refers to the percentage of UV radiation that can penetrate or pass through a material.

In the present invention, a UV blocking layer comprising ARC layers 112 and 114 can have a desirably low UV transparency by appropriately selecting the respective composition and thickness of ARC layers 112 and 114. By way of example, the UV transparency of the UV radiation blocking layer comprising ARC layers 112 and 114 can be less than approximately 1.0 percent. In the present embodiment, ARC layers 112 and 114 are selected such that ARC layers 112 and 114 have a different n and k. In one embodiment, ARC layers 112 and 114 can be selected such that ARC layers 112 and 114 have the same n and k. In the present embodiment, at least one of ARC layers 112 and 114 is a silicon-rich layer. In one embodiment, ARC layers 112 and 114 may both be silicon-rich layers.

As discussed above, UV radiation associated with semiconductor fabrication processes, such as plasma etching and CVD processes, can cause induced charges to be stored in dielectric layers situated in and adjacent to memory cells, such as memory cells 102, 104, and 106. The stored UV radiation-induced charges can adversely affect memory cell performance by undesirably increasing memory cell Vt (i.e., threshold voltage). UV radiation-induced charges can also reduce memory cell reliability by damaging silicon oxide layer 126, which provides a "tunnel" for electrons to charge silicon nitride layer 128 during programming of memory cell 102. Thus, by utilizing a UV radiation blocking layer comprising dual ARC layers, i.e. ARC layers 112 and 114, the present invention blocks UV radiation that can adversely affect memory cells 102, 104, and 106. As a result, the present invention achieves increased control of memory cell threshold voltage, which advantageously results in increased memory cell performance and decreased memory cell power consumption. Additionally, by utilizing the UV radiation blocking layer discussed above to prevent UV radiation from damaging silicon oxide layer 126, the present invention advantageously achieves increased memory cell reliability.

Also shown in FIG. 1, oxide cap layer 116 is situated over ARC layer 114 and can comprise undoped TEOS oxide or other appropriate oxide, such as silicon oxide. By way of example, oxide cap layer 114 can have a thickness of between approximately 500.0 Angstroms and 1500.0 Angstroms and can be deposited using a PECVD process. Oxide cap layer 116 protects ARC layers 112 and 114 from damage from a subsequent chemical mechanical polish ("CMP") and etch processes, which are utilized to remove excess metal after contact hole 118 is filled with tungsten or other appropriate metal. Further shown in FIG. 1, contact hole 118 extends through oxide cap layer 116. ARC layers 112 and 114, ILD layer 110, and ONO stack 122. Contact hole 118 can be formed, for example, by depositing and patterning a layer of photoresist on oxide cap layer 116 to determine a contact hole opening. Oxide cap layer 116, ARC layers 112 and 114, ILD layer 110, and ONO stack 122 can then be etched using a plasma etch to form contact hole 118.

In addition to blocking UV radiation resulting from the plasma etch process utilized to form contact hole 118, ARC layers 112 and 114 significantly reduced unwanted reflections during photolithographic printing of the contact hole opening. As a result, the present invention advantageously achieves increased critical dimension ("CD") control of contact hole 118. As a result, contact hole 118 can be filled with tungsten or other appropriate metal in a subsequent process step to form a contact having a desirably small CD. Thus, by utilizing dual ARC layers, i.e. ARC layers 112 and 114, the present invention achieves the flexibility to block damaging UV radiation and to increase contact CD control.

Figure 2:
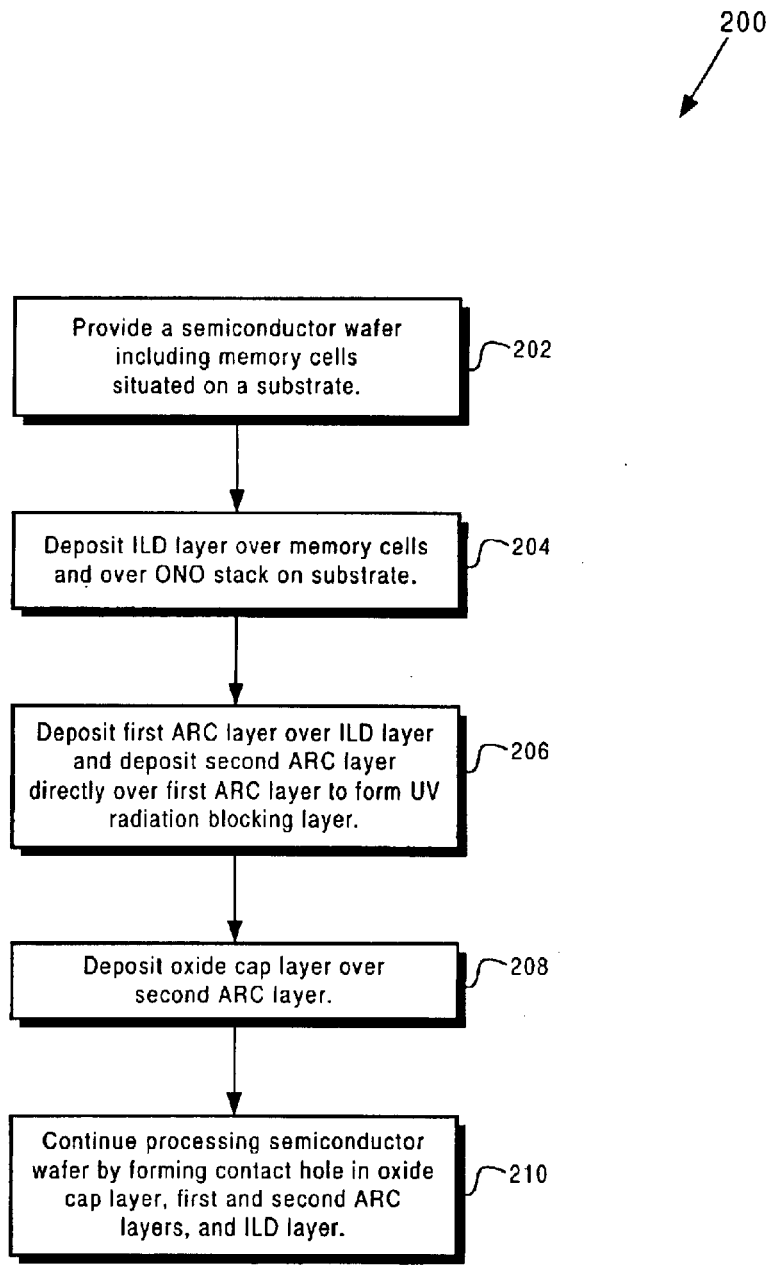
FIG. 2 is a flow chart corresponding to exemplary method steps according to one embodiment of the present invention.

FIG. 2 shows a flow chart illustrating an exemplary method according to one embodiment of the present invention. Certain details and features have been left out of flow chart 200 that are apparent to a person of ordinary skill in the art. For example, a step may consist of one or more substeps or may involve specialized equipment or materials, as known in the art.

At step 202, a semiconductor wafer is provided, which includes memory cells, such as memory cells 102, 104, and 106 in FIG. 1, situated on a silicon substrate, such as silicon substrate 108. At step 204, an ILD layer, such as ILD layer 110, is deposited over the memory cells and over an ONO stack on the silicon substrate. For example, ILD layer 110 can be deposited over memory cells 102, 104, and 106 and over ONO stack 122 on silicon substrate 108 using a CVD process. At step 206 a first ARC layer can be deposited over the ILD layer and a second ARC layer can be directly deposited over the first ARC layer. For example, ARC layer 112 can be deposited over ILD layer 110 using a PECVD process and ARC layer 114 can be directly deposited over ARC layer 112 using a PECVD process. ARC layers 112 and 114 form a UV radiation blocking layer that protects memory cells 102, 104, and 106 from adverse affects, such as decreased memory cell performance and reliability, caused by UV radiation-induced charges. At step 208, an oxide cap layer is deposited over the second ARC layer. For example, oxide cap layer 116 can be deposited over ARC layer 114 using a PECVD process. Oxide cap layer 116 protects ARC layers 112 and 114 from damage from subsequent CMP and etch processes and also prevents shorting of interconnect metal that is subsequently deposited and patterned over oxide cap layer 116. At step 210, processing of the semiconductor wafer continues by patterning and etching a contact hole, such as contact hole 118 in FIG. 1.

Thus, as discussed above, by utilizing dual ARC layers, the present invention effectively prevents process-induced UV radiation from adversely affecting memory cells and achieves increased control of contact CD. As a result, the present invention advantageously achieves increased memory cell performance and reliability and a desirably small contact CD.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, structure and method for preventing UV radiation damage in a memory cell and improving contact CD control have been described.

What is claimed is:

1. A structure comprising:
   a substrate;
   at least one memory cell situated on said substrate;
   an interlayer dielectric layer situated over said at least one memory cell and over said substrate;
   a first antireflective coating layer situated over said interlayer dielectric layer;
   a second antireflective coating layer situated directly over said first antireflective coating layer;
   an oxide cap layer situated over said second antireflective coating layer;
   wherein at least one of said first antireflective coating layer and said second antireflective coating layer is a silicon-rich layer.

2. The structure of claim 1 wherein said first antireflective coating layer has a first refraction index and a first absorption coefficient and said second antireflective coating layer has a second refraction index and a second absorption coefficient, said first refraction index and said first absorption coefficient being respectively different than said second refraction index and said second absorption coefficient.

3. The structure of claim 1 wherein said first antireflective layer and said second antireflective layer form a UV radiation blocking layer, said UV radiation blocking layer having a UV transparency less than approximately 1.0 percent.

4. The structure of claim 1 wherein said first antireflective layer is selected from the group consisting of silicon oxynitride, silicon nitride, silicon-rich oxide, and silicon-rich nitride.

5. The structure of claim 1 wherein said second antireflective layer is selected from the group consisting of silicon oxynitride, silicon nitride, silicon-rich nitride, and silicon-rich oxide.

6. The structure of claim 1 wherein each of said first antireflective coating layer and said second antireflective coating layer has a thickness of between approximately 100.0 Angstroms and approximately 500.0 Angstroms.

7. The structure of claim 1 wherein said at least one memory cell is a SONOS flash memory cell.

8. A structure comprising a substrate, at least one memory cell situated on said substrate, an interlayer dielectric layer situated over said at least one memory cell and over said substrate, a first antireflective coating layer situated over said interlayer dielectric layer, said structure being characterized in that:
   a second antireflective coating layer is situated directly over said first antireflective coating layer, wherein at least one of said first antireflective coating layer and said second antireflective coating layer is a silicon-rich layer, wherein an oxide cap layer is situated over said second antireflective coating layer.

9. The structure of claim 8 wherein said first antireflective coating layer comprises a first refraction index and a first absorption coefficient and said second antireflective coating layer comprises a second refraction index and a second absorption coefficient, said first refraction index and said first absorption coefficient being respectively different than said second refraction index and said second absorption coefficient.

10. The structure of claim 8 wherein said first antireflective layer and said second antireflective layer form a UV radiation blocking layer, said UV radiation blocking layer having a UV transparency less than approximately 1.0 percent.

11. The structure of claim 8 wherein said first antireflective layer is selected for the group consisting of silicon oxynitride, silicon nitride, silicon-rich oxide, and silicon-rich oxide.

12. The structure of claim 8 wherein said second antireflective layer is selected from the group consisting of silicon oxynitride, silicon nitride, silicon-rich nitride, and silicon-rich oxide.

* * * * *